United States Patent [19]

Ordines

[11] Patent Number: 5,162,985
[45] Date of Patent: Nov. 10, 1992

[54] MEASURING CIRCUIT FOR MEASURING INSTANTANEOUS POWER ACROSS A NON-REACTIVE LOAD

[75] Inventor: Jean-Pierre Ordines, Clamart, France

[73] Assignee: Valeo Vision, Bobigny Cedex, France

[21] Appl. No.: 698,810

[22] Filed: May 13, 1991

[30] Foreign Application Priority Data

May 17, 1990 [FR] France ............................ 90 06182

[51] Int. Cl.⁵ ............................................ H02M 7/42
[52] U.S. Cl. ........................................ 363/80; 363/97; 323/205; 323/285; 315/308
[58] Field of Search ................. 363/79, 80, 97; 323/205, 285; 324/141, 142; 315/219, 224, 307, 308

[56] References Cited

U.S. PATENT DOCUMENTS

| | | | |
|---|---|---|---|
| 3,978,390 | 8/1976 | Remery | 363/131 |
| 4,276,496 | 6/1981 | Arena-Ochoa | 315/DIG. 7 |
| 4,412,156 | 10/1983 | Oto | 315/308 |
| 4,694,193 | 9/1987 | Schlenk et al. | 363/21 |
| 4,833,401 | 5/1989 | So . | |
| 4,888,673 | 12/1989 | Droege | 363/21 |
| 4,908,753 | 3/1990 | Takahashi | 363/21 |
| 5,039,921 | 8/1991 | Kakitani | 315/307 |
| 5,061,890 | 10/1991 | Longini | 324/107 |

FOREIGN PATENT DOCUMENTS

2099594 12/1982 United Kingdom .

Primary Examiner—Steven L. Stephan
Assistant Examiner—Adolf Berhane
Attorney, Agent, or Firm—Dennison, Meserole, Pollack & Scheiner

[57] ABSTRACT

A resistive load, such as a discharge lamp, is connected in a circuit which includes a measuring circuit for measuring the instantaneous power absorbed at the terminals of the load. The measuring circuit includes:
  measuring means for measuring a low voltage at the foot of the secondary of the transformer which supplies a high voltage supply to the load, such that the measured voltage is an analogue of the voltage across the terminals of the load;
  a second measuring means for measuring the current passing through the transformer secondary in phase with the measured low voltage, this measured current being an analogue of the current passing through the load;
  rectifier circuits for rectifying the measured current and voltage; and
  a processing circuit for processing the rectified signals and to produce in response to them an output signal representing the instantaneous power taken by the load.

9 Claims, 2 Drawing Sheets

MEASURING CIRCUIT FOR MEASURING INSTANTANEOUS POWER ACROSS A NON-REACTIVE LOAD

FIELD OF THE INVENTION

This invention relates to measuring circuits for measuring instantaneous power absorbed at the terminals of a non-reactive load, for example a discharge lamp.

The invention also relates to a lighting circuit, especially though not necessarily for a vehicle, wherein the circuit is of the kind including a discharge lamp which is supplied via a transformer, from a power supply means including pulsing means.

The invention is mainly applicable to motor vehicles.

BACKGROUND OF THE INVENTION

It has already been proposed in the prior art to provide apparatus which enables the power dissipated by a discharge lamp to be continuously measured. The reliability of a lighting circuit, as well as the light output of spotlights or headlights, depends largely on the power that is supplied to the discharge lamp from the power supply means. In practice, it is necessary that the power that is supplied to the discharge lamp must be strictly controlled during discharge.

In the prior art, it has also been proposed to provide apparatus which enables both the voltage and current passing through a resistive load to be measured simultaneously. However, in the kind of context to which this invention relates, the hot point of the discharge lamp is at a high voltage. For this reason, direct measurement is not considered to be practicable for motor vehicles.

A further type of arrangement has also been proposed, in which the current passing through the discharge lamp, and the voltage across the terminals of a group of a few selected turns at the foot of the secondary of the supply transformer for the discharge lamp, are measured. However, such a solution has a number of drawbacks which will be discussed below. In particular, such a solution calls for the use of a four-quadrant analogue multiplier. Thus the voltage and current which are measured are not in phase, so that the algebraic product of the measured current and measured voltage has to be calculated.

Multiplication circuits of the kind mentioned above require both positive and negative supplies, thus making the use of this kind of solution in motor vehicles somewhat complex.

OBJECTS OF THE INVENTION

It is an object of the invention to overcome the various drawbacks of the prior art mentioned above, and to this end the present invention proposes a measuring circuit for measuring the instantaneous power across the terminals of a resistive load such as a discharge lamp, the circuit being in an improved form. The discharge lamp is supplied with power through a pulsing circuit through a voltage transformer.

SUMMARY OF THE INVENTION

According to the invention, in a first aspect, such a measuring circuit comprises:
 a first measuring means for measuring a voltage signal, this measured voltage signal being an image or analogue of the voltage across the terminals of the load;
 a second measuring means for measuring the current passing through the transformer secondary, this measured current being a signal in phase with the measured voltage signal;
 rectifying circuits for rectifying the said measured current and voltage signals; and
 a processing circuit for processing the rectified signals and for producing an output signal which represents the instantaneous power absorbed by the resistive load.

In a second aspect, the invention relates to a lighting circuit, especially for vehicles, incorporating such a measuring circuit. Such a lighting circuit is of the kind comprising a discharge lamp which is supplied with power through a transformer by a power supply means having a pulsing means with adjustable cyclic ratio and frequency.

In particular, the invention in this second aspect is characterised in that the lighting circuit further includes a measuring circuit for the instantaneous power absorbed at the terminals of the discharge lamp, in accordance with the invention in its said first aspect, with the output of the measuring circuit being connected to a circuit for controlling the frequency and the cyclic ratio of the pulsing means.

Further features and advantages of the present invention will be apparent from the description of a preferred embodiment, given below by way of example only and with reference to the accompanying drawings.

DESCRIPTION OF A PREFERRED EMBODIMENT OF THE INVENTION

Figure 1:
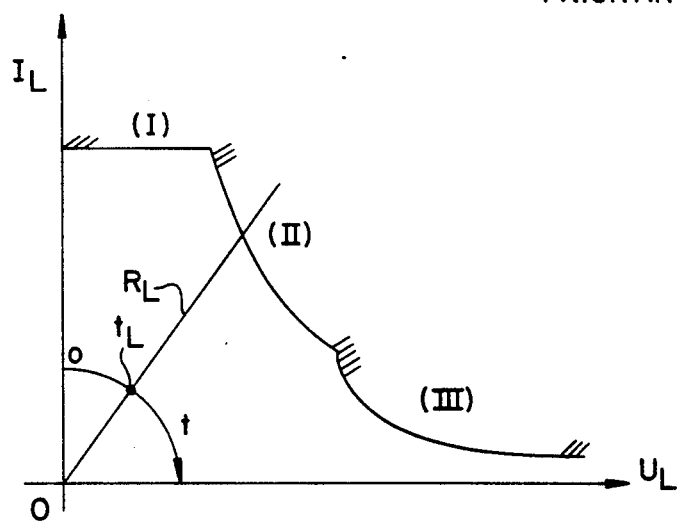
FIG. 1 is a current-voltage diagram at the terminals of the discharge lamp.

FIG. 1 is a diagram showing the power absorbed at the terminals of a discharge lamp. The current passing through the lamp is represented on the abscissa, while the ordinate shows voltage at the terminals of the lamp. This power diagram has three successive regions I, II, III between the establishment of the arc and the establishment of the permanently energised state.

The instantaneous resistance of the lamp RL at one point on this three-part curve is measured by the ratio UL/IL, while the angles measured from the ordinate towards the abscissa represent the time for establishment of the permanently energised state of the lamp.

For satisfactory operation, it is necessary that the power supply for the discharge lamp must not exceed the values defined by the three-part curve shown in FIG. 1. The closer this curve is approached, however, the better will be the performance of the lighting system. As a result, it is desirable to provide, in general, a power control means which is as precise and reliable as possible.

Figure 2:
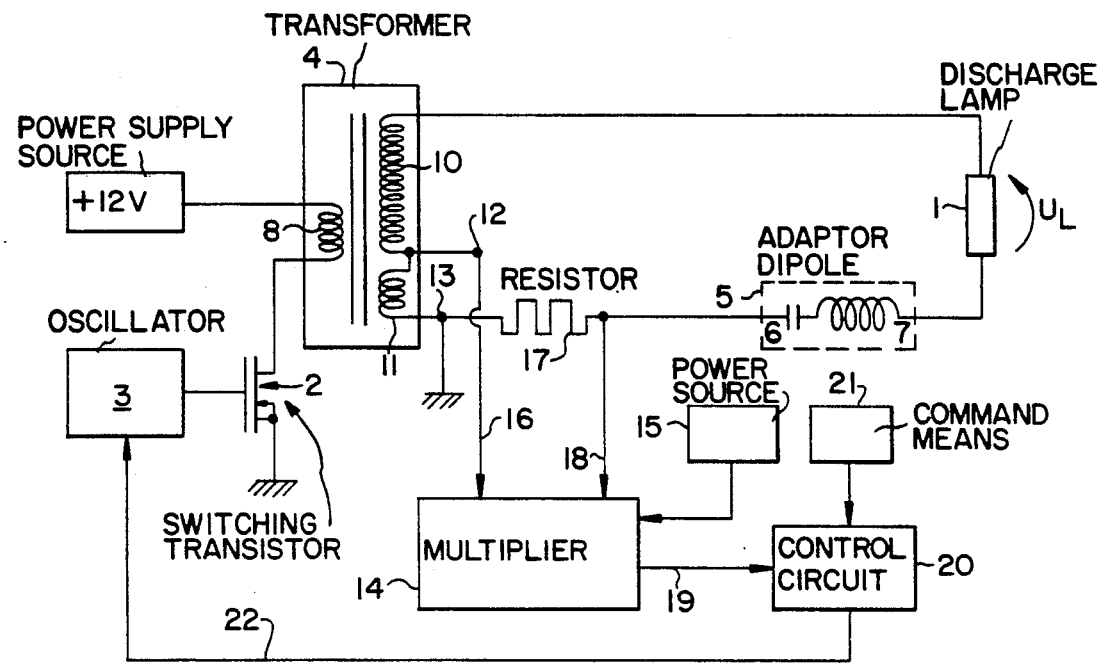
FIG. 2 is an electrical block diagram showing an embodiment according to the prior art.

In the prior art arrangement shown in one form in FIG. 2, a means for controlling this instantaneously absorbed power is shown. In FIG. 2, the transformer 4 has a primary winding 8, the hot end of which is connected to the general supply source for the circuit, at a voltage of +12 V for example, while the foot of the winding is connected to a switching transistor 2. The gate of the switching transistor 2 is controlled by an oscillator 3, the cyclic ratio and frequency of which are adjustable.

Between the foot 13 of the secondary winding of the transformer 4 and the cold point of the discharge lamp 1, it is necessary to arrange, generally, an adaptor dipole 5 consisting of a capacitor 6 and an inductance 7. In other cases, this dipole may consist of a capacitor alone. The characteristics of the dipole 5 are chosen in accordance with the instructions issued by the manufacturer of the discharge lamp 1.

In order to measure instantaneous power, in the prior art a system has been proposed in which a partial winding 11 is provided at the foot of the secondary winding, this winding 11 being for example of three turns. The instantaneous voltage across the terminals of the partial winding 11 is measured as indicated at 16. In addition, between the foot of the secondary winding 13 and the dipole 5, a resistor 17 is connected so as to enable the current passing through the secondary winding 10, 11 to be measured, the current consumed at the point 12 being small. For this reason, the current passing through the resistor 17 is equal at any instant to the current passing through the discharge lamp.

In addition, the voltage measured at the point 12 with respect to ground at 13 is proportional to the voltage across the terminals of the secondary winding. This voltage at the terminals of the secondary winding develops in substantially the same way as the voltage across the terminals of the resistive load 1. However, the dipole 5 causes a perturbation of both phase and amplitude between these two measurements.

The arrangement shown in FIG. 2 satisfactorily resolves the problem of measurement of a high voltage by avoiding the need to take any measurements at the hot point. However, against this must be set the fact that, because of the influence of the dipole 5, a quadrant multiplier 14 has to be used in order that a measurement of power can be deduced. This is a further disadvantage of the prior art.

The current measurement, at 18, and the voltage measurement, at 16, are input to this multiplier 14, which is of the analogue type. Because the phase relationship between the current and voltage measured at these points is unknown, a multiplication has to be carried out in all four quadrants of the voltage/current intensity graph. The result of this calculation, at the output 19 of the analogue multiplier 14, is proportional to the product of the current passing through the lamp 1 and the voltage across the terminals of the secondary winding 10, 11. This output signal can then be processed by a control circuit 20 under the control of a suitable command means 21. The control circuit 20 produces an output signal 22, for controlling the oscillator 3 by adjustment of its cyclic ratio and frequency.

The four-quadrant analogue multiplier 14 should also be supplied through both positive and negative power sources. Such an arrangement therefore calls for a further voltage source 15, other than the main supply source of the vehicle.

In order to overcome these disadvantages of the prior art, the present invention proposes a means which permits simultaneous measurement of the current and the voltage at the terminals of the discharge lamp, without having to go close to the high voltage, that is to say close to the hot points.

Figure 3:
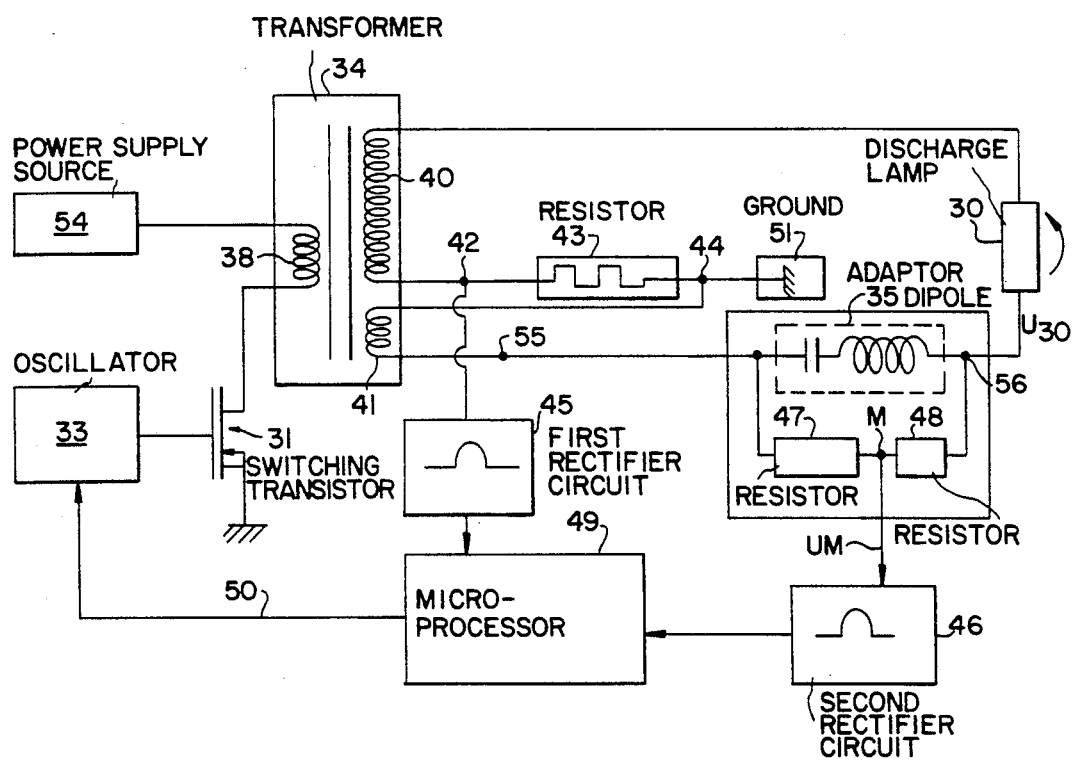
FIG. 3 is an electrical block diagram showing an embodiment of the present invention.

Thus in the embodiment of the invention shown in FIG. 3, the lighting circuit includes a discharge lamp 30 which is connected across the terminals of the secondary 40, 41 of the transformer 34. The transformer 34 has a primary winding 38, the hot point of which is connected to the power supply source 54 of the vehicle, while its foot is connected to the collector of the switching transistor 31.

The secondary of the transformer is divided into two windings 40, 41. The winding 40 comprises the high voltage side, while the winding 41 consists only of a few turns and comprises the "ground" side. A resistor 43 is inserted between terminals 42 and 44 the two windings 40 and 41. The winding 41 is connected at 44 both to the resistor 43 and to ground at terminal 51. In a modified embodiment, the connecting point 44 is connected to a voltage source such as to enable the voltage of the system to be biassed. The terminal 42 of the high voltage secondary winding 40 is one measuring point, at which the intensity of the current passing through the secondary, and thus through the load 30 is measured. In this embodiment the current measurement signal at 42 has a form which is identical to that of the current passing through the load 30.

The gate of the switching transistor 31 is connected to the output of an oscillator 33, with adjustable cyclic ratio and frequency. In addition, the low voltage terminal 55 of the secondary winding 41 is connected to the point 56 of the discharge lamp 30 through the adaptor dipole 35, which is similar to the dipole 5 already described with reference to FIG. 2. In addition, a series of resistors 47, 48 is connected across the terminals 55, 56 of the dipole 35. The point M, common to the two resistors 47 and 48, is a point at which the voltage with respect to ground is proportional to the voltage across the terminals of the lamp 30, and this voltage is in phase with the latter. The measured voltage signal UM at this point, with respect to the ground 51, is an image of the voltage across the terminals of the load 30.

Accordingly, if the first winding 40 of the secondary has N1 turns, and the second winding 41 has N2 turns, then the ratio of the numbers of turns is expressed by:

$$K = N2/N1 + N2.$$

The resistor 47 has a value R2 and the resistor 48 a value R1, such that:

$$K = R2/R1 + R2.$$

The voltage at the point M with respect to ground is therefore given by the equation:

$$UM = K.U35 - K.US,$$

where U35 is the voltage across the terminals of the dipole 35 and US is the voltage across the whole of the secondary of the transformer 34.

Therefore:

$$UM = -K(US - U35),$$

where UL is the voltage across the terminals of the load 30. Since UL=US−U35, it follows that UM=−-K.UL, i.e. the voltage measured at the point M is inversely proportional to the voltage across the load.

Accordingly, the voltage measured at the point M is an exact image of the voltage across the terminals of the discharge lamp. In addition, since the load is purely resistive, the voltage across its terminals and the current passing through it are in phase, and the same is true for the analogue voltage measured at M.

It is thus possible to work in the first quadrant of the current-voltage diagram. It follows that the need for an analogue multiplier is eliminated, so that it is only necessary to rectify the current measured at the point 42 and the voltage measured at the common terminal M of the resistors 47, 48 and provide the output to the multiplier. To this end, a first rectifier circuit 45 is provided for rectification of the current measured at the point 42, together with a further rectifier 46 for rectifying the voltage measured at the point M.

The rectified outputs from the rectifiers are fed to analogue-to-digital convertors, not shown in the drawings, the outputs of which are processed by a microprocessor 49. The latter is programmed so as to perform an instantaneous calculation of the power absorbed during the cut-off portion of the cycle of the oscillator 33. In a preferred embodiment, the analogue-to-digital convertors are incorporated within the housing of the microprocessor 49. The output of the microprocessor 49 transmits a signal 50 which, in accordance with a suitable programme, serves to regulate the cyclic ratio and frequency of the oscillator 33.

In the embodiment described above, a bridge consisting of two resistors has been used as the means for generating the image or analogue voltage of the voltage U30 across the terminals of the load. However, other impedances may be used, depending on the complexity of operation of the load.

The circuit which produces the image voltage UM generates a signal in phase with the intensity of current measured at the point 42. Thus the measurement of power at the low tension side of the circuit is made possible without error and without any complexity.

What is claimed is:

1. A circuit for measuring the instantaneous power consumed by a non-reactive load which load is supplied with pulsating power, comprising:
   a voltage transformer having a primary winding and a pair of secondary windings,
   a pulsing circuit connected to the primary winding,
   said pair of secondary windings including a high voltage winding,
   a low voltage winding, each of the secondary windings having first and second terminals;
   a non-reactive load, a first high voltage winding terminal connected to said non-reactive load;
   a first means for providing a current signal connected between the second high voltage winding terminal and the first low voltage winding terminal, said current signal being proportional to the current consumed by the non-reactive load;
   a second means for providing a voltage signal proportional to the voltage across the non-reactive load connected between the second low voltage winding terminal and said non-reactive load, said voltage signal being in phase with said current signal;
   first and second rectifier means responsive to said current signal and to said voltage signal respectively for generating rectified signals; and
   a processing circuit responsive to said rectified signals for generating a measurement signal which corresponds to the instantaneous power absorbed by said non-reactive load.

2. A circuit according to claim 1, wherein said second means for providing a signal proportional to the voltage includes a voltage divider consisting of two impedances connected in series between the load and the second terminal of the low voltage winding of the transformer secondary.

3. A circuit according to claim 2, wherein said impedances of the voltage divider are resistors.

4. A circuit according to claim 1, wherein said processing circuit produces an analogue output signal in response to the output signals from the rectifier means.

5. A circuit according to claim 1, wherein the first means for providing a current signal includes a resistor having a first end connected to the second terminal of said high voltage winding and a second end connected to the first terminal of said low voltage winding and said first terminal of the low voltage winding being connected to ground.

6. A circuit according to claim 2, wherein the number of turns in the high voltage winding is substantially larger than the number of turns in the low voltage winding and the ratio of the two impedances of the voltage divider is equal to the ratio of the number of turns in the high voltage winding to the number of turns in the low voltage winding of the transformer secondary.

7. A circuit according to claim 1, wherein said processing circuit produces a digital output signal in response to the output signals from the rectifier means.

8. In a system for supplying controlled power to a non-reactive load having terminals connected to the output of secondary windings of a transformer,
   a circuit for measuring the instantaneous power consumed by a non-reactive load which load is supplied with pulsating power, comprising:
   a voltage transformer having a primary winding and a pair of secondary windings,
   a pulsing circuit connected to the primary winding,
   said pair of secondary windings including a high voltage winding,
   a low voltage winding, each of the secondary windings having first and second terminals;
   a non-reactive load, a first high voltage winding terminal connected to said non-reactive load;
   a first means for providing a current signal connected between the second high voltage winding terminal and the first low voltage winding terminal, said current signal being proportional to the current consumed by the non-reactive load;
   a second means for providing a voltage signal proportional to the voltage across the non-reactive load connected between the second low voltage winding terminal and said non-reactive load, said voltage signal being in phase with said current signal;
   first and second rectifier means responsive to said current signal and to said voltage signal respectively for generating rectified signals; and
   a processing circuit responsive to said rectified signals for generating a measurement signal which corresponds to the instantaneous power absorbed by said non-reactive load.

9. The system according to claim 8, wherein said pulsing circuit comprises a power supply source, a variable frequency controllable oscillator and a switching transistor, said measurement signal corresponding to instantaneous power is applied to the oscillator for varying the frequency.

* * * * *